United States Patent [19]

Bates, Jr.

[11] Patent Number: 5,032,791
[45] Date of Patent: Jul. 16, 1991

[54] APPARATUS FOR TESTING HALL EFFECT DEVICE

[75] Inventor: James F. Bates, Jr., Fond du Lac, Wis.

[73] Assignee: A & E Manufacturing Co., Inc., Milwaukee, Wis.

[21] Appl. No.: 389,411

[22] Filed: Aug. 4, 1989

[51] Int. Cl.$^5$ .............................................. G01R 35/00
[52] U.S. Cl. ................................. 324/202; 324/537; 324/381; 324/117 H
[58] Field of Search ............... 324/381, 383, 385, 386, 324/202, 537, 117 H

[56] References Cited

U.S. PATENT DOCUMENTS

| | | | |
|---|---|---|---|
| 3,210,653 | 10/1965 | Williams | 324/385 |
| 3,241,055 | 3/1966 | Knudsen | 324/385 |
| 4,156,191 | 5/1979 | Knight | 324/202 |
| 4,488,112 | 12/1984 | Thompson | 324/202 |
| 4,491,794 | 1/1985 | Daley | 324/202 |
| 4,514,687 | 4/1985 | Van Husen | 324/158 R |
| 4,692,697 | 9/1987 | Bray | 324/202 |
| 4,829,248 | 5/1989 | Loubier | 324/202 |

Primary Examiner—Kenneth A. Wieder
Assistant Examiner—Jose M. Solis
Attorney, Agent, or Firm—Fuller, Ryan & Hohenfeldt

[57] ABSTRACT

An apparatus for testing the operativeness of a Hall effect device (HED), such as in an automotive application, without requiring removal of the HED for testing. The apparatus includes a connector for connection to the HED, a connector for connection to a voltage supply, and an indicator. A permanent magnet is physically positioned with respect to the HED so that a properly functioning HED would produce a Hall effect current within a predetermined range. A ferrous metal strip is provided, shiftable between an interference position between the permanent magnet and the HED and a clear position not between the permanent magnet and the HED. The indicator is connected so as to be lit when the HED is producing a current within the predetermined range, and not lit when the HED is not producing a current within the predetermined range. Also disclosed is a method for testing the operativeness of a HED. The method includes supplying a testing apparatus as described above. The apparatus is connected to inputs of the HED, and the indicator observed. The metal strip is then positioned between the permanent magnet and the HED, and the indicator observed, to determine whether the HED is producing a current of at least the predetermined level. In a disclosed embodiment, the HED constitutes part of a vehicle engine distributor, and the ferrous metal strip may be a distributor rotor vane.

5 Claims, 1 Drawing Sheet

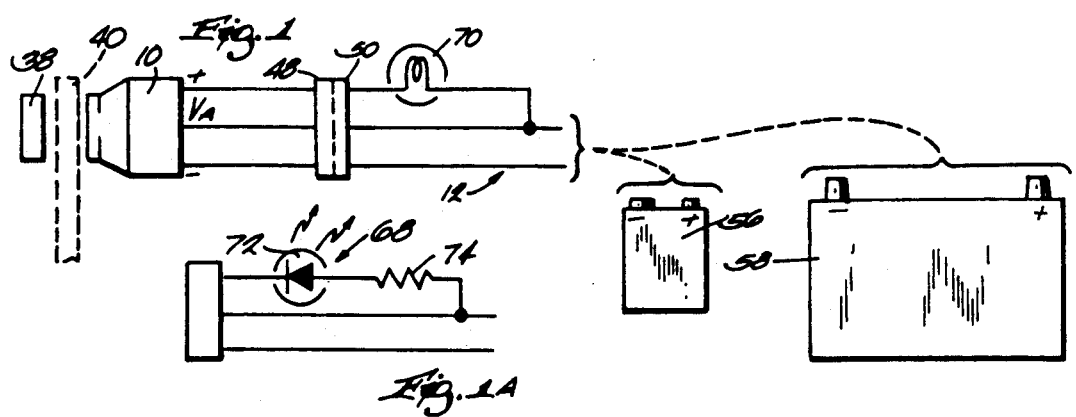
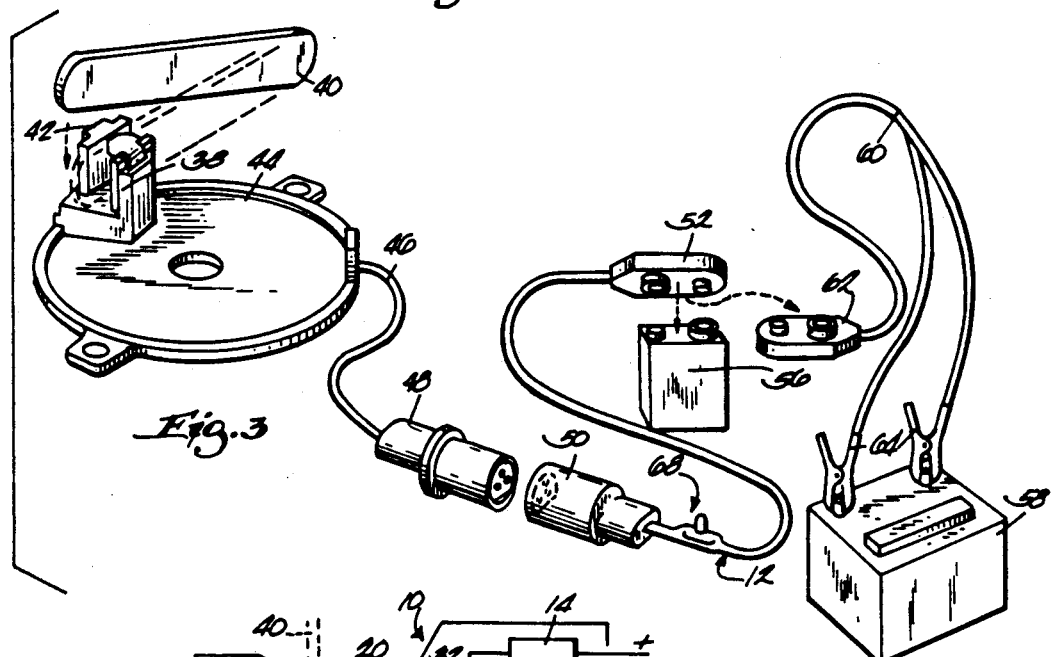
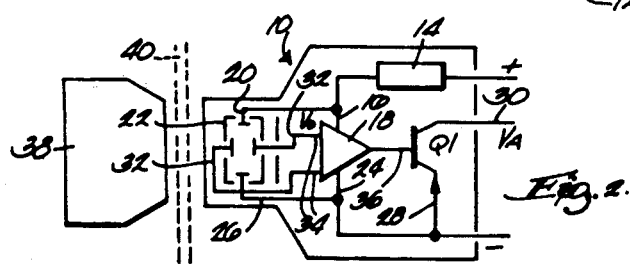
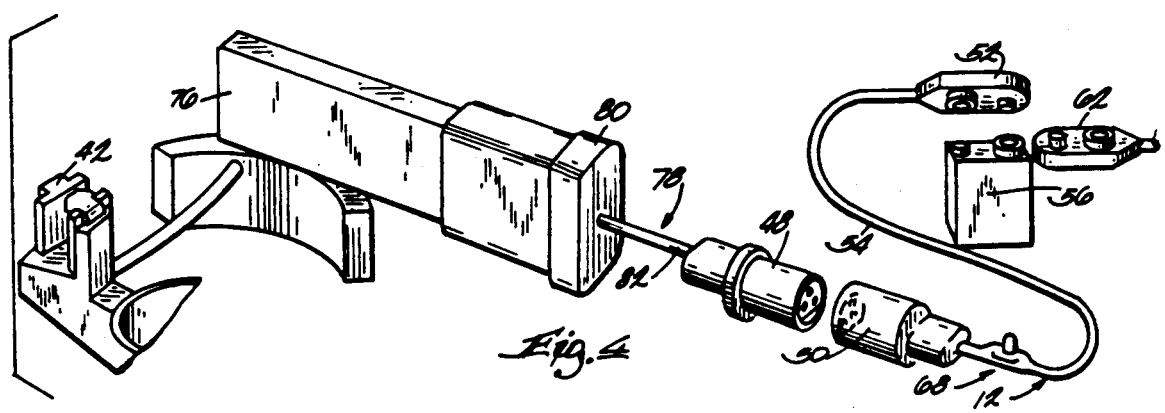

APPARATUS FOR TESTING HALL EFFECT DEVICE

BACKGROUND OF THE INVENTION

This invention relates to automotive testing devices, and in particular to an apparatus to test the functioning of a Hall effect device without requiring removal from the vehicle.

Many late model motor vehicle ignition systems include a Hall effect device mounted in the ignition distributor. In use in that manner generally the device replaces the "ignition points" or "contact points" of older models as an electrical switch to separate the spark for each cylinder. Moreover, Hall effect devices are finding much wider uses throughout the auto industry, in applications as varied as anti-lock braking systems and fuel timing systems. Up to the present time, however, in the event that a problem arose wherein the Hall effect device was suspected to be defective, there was no easy way to test the Hall effect device to determine whether it worked, short of replacing it, or at least removing it for testing. Since these Hall effect devices are generally epoxied or otherwise formed into a larger part, removing or replacing the Hall effect device meant a large disassembly job, with the attendant waste of time and money if the Hall effect device was not at fault. Clearly, some easier means of testing the Hall effect device would be desirable.

Other apparatus denominated as testing circuits for Hall effect devices, such as those shown in Thompson, U.S. Pat. No. 4,488,112, Daley, U.S. Pat. No. 4,491,794 and Van Husen, U.S. Pat. No. 4,514,687, are not directed to this particular usage. Rather, they are provided for the purpose of testing the operate and release time and point failures of Hall effect devices, and include variable magnetic fields, measuring the voltage of the Hall effect device. Hence these devices are prohibitively expensive for wide usage in the auto repair industry. Further, they do not address the problem of requiring removal before testing.

This invention relates to improvements to the apparatus described above and to solutions to the problems raised or not solved thereby.

SUMMARY OF THE INVENTION

The invention relates to an integrated test apparatus for testing the operativeness of a Hall effect device (HED). The test apparatus includes means for providing a steady-state magnetic field and positioning means for physically positioning the HED and the magnetic field with respect to each other so that a properly functioning HED would produce a Hall effect current within a predetermined range. Field blocking means are provided, alternatively positionable between the field and the HED and not between the field and the HED. The invention includes an indicator, and means for connecting the indicator to the output of the HED. This indicator is active when the HED is producing a current within the predetermined range, and not active when the HED is not producing a current within the predetermined range.

The invention further includes a method for testing a HED for operativeness. The method includes providing a steady-state magnetic field, and positioning the HED with respect to the magnetic field so as to produce a Hall effect current of at least a predetermined level in a properly functioning HED. An indicator is connected to the output of the HED, and is active when a properly functioning HED is producing a current of at least the predetermined level, and inactive when a properly functioning HED is producing a current of less than the predetermined level. A current is provided to the inputs of HED, and the indicator observed to determine whether the HED being tested is producing a current of at least the predetermined level. A field blocking means is then placed between the magnetic field and the HED and the indicator is observed to determine whether the HED is producing a current of at least the predetermined level. If the results of either portion of the test are not as expected, the HED appears defective.

In particular, one embodiment of the apparatus of the invention relates to an apparatus for testing the operativeness of a Hall effect part of a vehicle engine distributor. The Hall effect part to which this embodiment is directed generally includes, in addition to a HED as indicated above, a permanent magnet physically positioned with respect to the HED so that a properly functioning HED would produce a Hall effect current within the predetermined range. A ferrous metal strip, such as a distributor rotor vane, acts as the field blocking means shiftable between an interference position between the permanent magnet and the HED and a clear position not between the permanent magnet and the HED. An indicator, such as an incandescent bulb or a light emitting diode, is lit when the HED is producing a current within the predetermined range, and not lit when the HED is not producing a current within the predetermined range. The permanent magnet and the HED are positioned with respect to each other by positioning means including a base to which both the permanent magnet and the Hall effect device are commonly attached.

A correspondingly particular embodiment of the method of the invention comprises a method for testing the operativeness of a Hall effect part of a vehicle engine distributor. As indicated above, certain types of automotive distributors include a Hall effect part, formed of a HED, a permanent magnet physically positioned with respect to the HED so that a properly functioning HED would produce a Hall effect current within a predetermined range or at least of a certain level, and field blocking means alternatively positionable between and not between the permanent magnet and the HED. The method includes supplying a testing device as described above, including an indicator, such as an incandescent bulb or a light emitting diode. The testing device is connected to inputs of the HED thereby providing a current to the inputs, and the indicator is observed to determine whether the HED is producing a current of the predetermined level, that is, whether the indicator is lit. The field blocking means is positioned between the permanent magnet and the HED, and the indicator is again observed to determine whether the HED is producing a current of at least the predetermined level, that is, whether the indicator is lit.

Other objects and advantages of the invention will become apparent hereinafter.

DESCRIPTION OF THE DRAWING

FIG. 1 is a schematic diagram of a circuit constructed according to a preferred embodiment of the present invention.

FIG. 1A is a schematic diagram of a circuit constructed according to an alternative embodiment of the invention.

FIG. 2 is a schematic diagram of a conventional Hall effect device.

FIG. 3 is an isometric view of a testing device constructed according to an embodiment of the invention.

FIG. 4 is an isometric view of a testing device constructed according to an alternative embodiment of the invention.

DESCRIPTION OF THE PREFERRED EMBODIMENTS

Referring now to FIG. 1, there is shown a schematic representation of a conventional Hall effect device (HED) 10 having an adapter 12 connected thereto, which adapter is constructed according to a preferred embodiment of the present invention.

The construction of the Hall effect device 10 is shown in more detail in FIG. 2. As there shown, the conventional HED 10 includes three terminals, a + terminal, a − terminal and a $V_A$ terminal. The + terminal connects, via a regulator 14, to a first power input 16 of a differential amplifier 18, and also to a first input terminal 20 of a Hall effect plate 22. The − terminal is in effect a ground, connected to a second input terminal 24 of the amplifier 18, a second input terminal 26 of the Hall effect plate 22, and the collector 28 of a transistor Q1. The $V_A$ terminal connects to the emitter 30 of the transistor Q1. The two sense electrodes 32 of the Hall effect plate 22 are connected to the amplifying inputs 34 of the amplifier 18. The output of the amplifier 18 is connected to the base 36 of the transistor Q1.

As indicated above, many late model motor vehicle ignition systems include a HED such as this mounted in the ignition distributor in place of the "ignition points" or "contact points" of older models as an electrical switch to separate the spark for each cylinder. Moreover, usage of HEDs is spreading rapidly throughout the automobile, including systems as diverse as crankshafts, camshafts, anti-lock braking systems, ride control and suspension, and fuel timing. The problem to which the present invention is directed arises when it becomes necessary to test the HED in any of these applications. The present invention is not intended to be limited to ignition systems, but rather to include testing any application or use of a HED without requiring removal.

As shown in FIG. 1, in the embodiment relating to the ignition system, a permanent magnet 38 is provided, spaced apart somewhat from the Hall effect plate 22, but positioned close enough so that a substantial and measurable voltage is provided at the $V_A$ terminal. A blade 40 is generally provided to be removably placed between the magnet 38 and the Hall effect plate 22, as shown best in FIG. 3, to interrupt the magnetic field, thus changing the voltage at the $V_A$ terminal. As shown best in FIGS. 3 and 4, the HED is generally epoxied into a portion 42 of a larger distributor part 44, and connected to the ignition system (not shown) by a connector cable 46, terminating in a connector 48 of a predetermined type. Removal of the distributor part 44 for testing is difficult and expensive.

As indicated above, the adapter 12 is provided to permit testing the HED 10 without removal of the distributor part 44. The adapter 12 includes a first connector 50 adapted to fit with and connect to the ignition system connector 48. The adapter 12 further includes a second connector 52 connected to the first connector 48 by a conductor 54, such as a wire. The second connector 52 is adapted to connect the adapter 12 to a voltage source, such as a 9-volt battery 56, to provide power to the adapter and HED as explained below. The second connector 52 is thus a 9-volt-type connector. Alternatively, the voltage source could be a 12-volt automobile battery 58, in which case an adapter cable 60 for connecting the 9-volt type connector 52 to the 12-volt battery would be needed. Adapter cable 60 has a 9-volt-type connector 62 at one end and a pair of clips 64 at the other end for connection to the terminals 66 of the automobile battery 58. Since the ignition part 44 is an automobile part and since one of the objects of the present invention is to permit testing of the HED without removal from the vehicle, a 12-volt automobile battery will often be readily available.

As can be seen by comparing FIGS. 1 and 3, the adapter 12 also includes an indicator means 68. A preferred embodiment of the indicator means 68 would include an illuminated indicator. In the embodiment shown in FIG. 1, the indicator means 68 includes an incandescent bulb 70, connected between the + terminal of the voltage source 56 or 58 and the + terminal of the HED 10. In the alternative embodiment shown in FIG. 1A, the indicator means 68 includes a light emitting diode (LED) 72, in series with a dropping resistor 74. Both the LED 72 and the resistor 74 are connected between the + terminal of the voltage source 56 or 58 and the + terminal of the HED 10.

Hence, in operation, the method of use may be described as follows. When the HED 10 is suspected to be defective, such as, in the embodiment relating to ignition systems, due to some ignition problem the vehicle may be having, the connector 48 of the ignition part 44 is disconnected from the wiring harness (not shown) of the vehicle, and the connector 50 of the adapter 12 connected thereto. With the opposite end connector 52 connected to a voltage source 56 or 58, either directly or by adapter cable 60, the indicator means 68 is observed. A working HED 10 will cause the indicator means 68 to be active, that is, will cause bulb 70 or LED 72 to be lit. A rotor vane or other type of ferromagnetic element or blade 40 is then inserted between the HED 10 and the permanent magnet 38 and the indicator means is again observed. At this point, a working HED 10 will result in the indicator means 68 being inactive, that is, will result in the bulb 70 or LED 72 not being lit. If the indication of the indicator means 68 in either observation is not as expected, the HED 10 has been determined to be defective, and should be replaced. If the indication of the indicator means 68 in both observations is just as expected, the HED 10 is determined to be working satisfactorily.

An alternative construction of the ignition part is shown in FIG. 4. There, the HED 10 is not provided with a connector 48, as in FIG. 3 but rather is connected directly to an ignition control module 76. In that case the invention provides for a module adapter 78, including a connector 80 for connection to the module, a wire 82 and a conventional connector 48. The adapter 12 may then be connected to connector 48, and used as described in the previous paragraph. In this embodiment, if the HED 10 can be eliminated from suspicion by use of the method described in the above paragraph, the module 76 itself is most likely defective.

While the apparatus hereinbefore described is effectively adapted to fulfill the aforesaid objects, it is to be understood that the invention is not intended to be limited to the specific preferred embodiment of apparatus for testing a Hall effect device set forth above. Rather, it is to be taken as including all reasonable equivalents within the scope of the following claims.

I claim:

1. A method for testing the operativeness of a Hall effect part of a vehicle engine distributor, said Hall effect part including a Hall effect device having inputs and outputs, a permanent magnet physically positioned with respect to said Hall effect device so that a properly functioning Hall effect device produces a Hall effect current within a predetermined range, and field blocking means alternatively positionable between and not between said permanent magnet and said Hall effect device, said method comprising the steps of:

supplying a testing device electrically connectable to said Hall effect part, said testing device comprising:
a current supply for providing a current to the inputs of said Hall effect device;
means for connecting said apparatus to said Hall effect device; and
an indicator associated with said connecting means, which indicator is active when said Hall effect device is producing a current within said predetermined range, and not active when said Hall effect device is not producing a current within said predetermined range;
connecting said device to said Hall effect inputs, thereby providing a current to said inputs;
observing said indicator to determine whether said Hall effect device is producing a current of said predetermined level;
positioning said field blocking means between said permanent magnet and said Hall effect device; and
observing said indicator to determine whether said Hall effect device is producing a current of said predetermined level.

2. A hand tool for testing a Hall effect part of a vehicle, said Hall effect part including a Hall effect device having inputs and outputs, a permanent magnet physically permanently positioned with respect to said Hall effect device so that a properly functioning Hall effect device would produce a Hall effect current within a predetermined range, said hand tool comprising:
a battery for providing a current to the inputs of said Hall effect device;
first connecting means for connecting said battery to said hand tool;
second connecting means for connecting said hand tool to said Hall effect device;
a light indicator connected between said first and second connecting means, which light indicator is lit when said Hall effect device is producing a current within said predetermined range, and not lit when said Hall effect device is not producing a current within said predetermined range.

3. A hand tool as recited in claim 2, further comprising field blocking means alternatively positioned between and not between said permanent magnet and said Hall effect device, such that if said Hall effect device is functioning properly said light indicator will be on when said field blocking means is not between said permanent magnet and said Hall effect device and will be off when said field blocking means is between said permanent magnet and said Hall effect device.

4. A hand tool as recited in claim 3 wherein said field blocking means comprises a strip of ferrous metal insertable between said permanent magnet and said Hall effect device.

5. A hand tool as recited in claim 2, wherein said indicator comprises a light emitting diode and a series resistor connected in circuit with said outputs of said Hall effect device.

* * * * *